United States Patent
Sato et al.

(12) 
(10) Patent No.: US 8,287,771 B2
(45) Date of Patent: *Oct. 16, 2012

(54) METHOD FOR PRODUCING SILVER PARTICLE POWDER

(75) Inventors: Kimitaka Sato, Honjo (JP); Yutaka Hisaeda, Honjo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 369 days.

This patent is subject to a terminal disclaimer.

(21) Appl. No.: 12/449,578

(22) PCT Filed: Feb. 15, 2007

(86) PCT No.: PCT/JP2007/053233
§ 371 (c)(1),
(2), (4) Date: Aug. 14, 2009

(87) PCT Pub. No.: WO2008/099510
PCT Pub. Date: Aug. 21, 2008

(65) Prior Publication Data
US 2010/0065789 A1    Mar. 18, 2010

(51) Int. Cl.
*H01B 1/02* (2006.01)
*H01B 1/22* (2006.01)
*C21B 15/00* (2006.01)
*C22B 15/00* (2006.01)

(52) U.S. Cl. ............ 252/514; 75/255; 75/363; 75/370; 75/710; 75/721; 264/319; 427/125; 427/216; 428/148; 428/402; 977/892

(58) Field of Classification Search .......... 252/514; 75/370, 363, 255, 392, 710, 721; 148/430; 427/216, 220, 125; 428/148, 402, 403; 264/319; 977/892
See application file for complete search history.

(56) References Cited

U.S. PATENT DOCUMENTS

| 6,737,231 B2 * | 5/2004 | Kawanishi et al. ......... 430/620 |
| 7,776,442 B2 * | 8/2010 | Sato .............................. 428/402 |
| 2009/0053469 A1 * | 2/2009 | Sato et al. ..................... 428/148 |

FOREIGN PATENT DOCUMENTS

| JP | 10-176205 | 6/1998 |
| JP | 11-319538 | 11/1999 |
| JP | 2001-35255 | 2/2001 |
| JP | 2003-253311 | 9/2003 |
| JP | 2005-026805 | 2/2005 |
| JP | 2005-026866 | 2/2005 |
| JP | 2005-36258 | 2/2005 |
| JP | 2005-056035 | 3/2005 |
| JP | 2005-206931 | 8/2005 |
| JP | 2006-213955 | * 8/2006 |

OTHER PUBLICATIONS

S. Ayyappan, R. Srinivasa Gopalan, G. N. Subbanna, C. N. R. Rao, Nanoparticles of Ag, Au, Pd, and Cu produced by alcohol reduction of the salts, J. Mater. Res., vol. 12, No. 2, Feb. 1997 â1997 Materials Research Society.*
Progress of Chemical Engineering 34, Mixing Technology, edited by the Society of Chemical Engineering of Japan, p. 14.
Progress of Chemical Engineering 34, Mixing Technology, edited by the Society of Chemical Engineering of Japan, p. 132.

* cited by examiner

*Primary Examiner* — Bijan Ahvazi
(74) *Attorney, Agent, or Firm* — Clark & Brody

(57) ABSTRACT

Provided is a method for producing a silver particle powder excellent in the dispersibility in a liquid organic medium having a low polarity, which comprises reducing a silver compound in an alcohol having a boiling point of from 80° C. to 200° C. or in a polyol having a boiling point of from 150 to 300° C., at a temperature of from 80° C. to 200° C. under reflux while maintaining the stream having a Reynolds number of not more than $3.70 \times 10^4$. The stream having a Reynolds number of not more than $3.70 \times 10^4$ can be maintained by stirring with a stirring power of not more than $5.68 \times 10^8$ W. According to the method, a silver particle powder having good low-temperature sinterability and good dispersibility and suitable for use for microwiring formation can be obtained at a high yield.

6 Claims, No Drawings

US 8,287,771 B2

METHOD FOR PRODUCING SILVER PARTICLE POWDER

TECHNICAL FIELD

The present invention relates to a method for producing a fine silver particle powder (especially having a nanometer-order particle size), more specifically to a method for producing such a silver particle powder favorable for an interconnecting material (in other words, a wiring material) for forming a circuit micropattern, for example, for an interconnecting material for an inkjet method, or the like.

BACKGROUND ART

When the size of a solid substance is on a nm-order (nanometer-order), the specific surface area thereof is extremely large, and therefore, though it is solid, its interface with vapor or liquid is extremely large. Accordingly, its surface characteristics greatly control the properties of the solid substance. For a metal particle powder, it is known that the melting point of the powder dramatically lowers as compared with that as a bulk, and therefore, as compared with particles on a μm-order, the particle powder on a nm-order has some advantages in that it enables micropatterning in interconnecting and it may be sintered at a low temperature. Of such a metal particle powder, a silver particle powder has low electric resistance and has high weather resistance, and the cost of the metal is lower than that of other noble metals, and therefore a silver particle powder is especially expected as a next-generation interconnecting material for micropatterning in interconnecting formation.

For producing a nm-order silver particle powder, there are known a vapor-phase method and a liquid-phase method as roughly classified. The vapor-phase method is generally a method of evaporation in vapor, and Patent Reference 1 describes a method of evaporating silver under a low pressure of 0.5 Torr or so in an inert gas atmosphere of helium or the like. Regarding the liquid-phase method, Patent Reference 2 discloses a method for producing a silver colloid, which comprises reducing a silver ion with an amine in an aqueous phase and transferring the resulting silver fine particles into an organic solvent phase containing a high-molecular-weight dispersant. Patent Reference 3 describes a method for reducing a silver halide with a reducing agent (alkali metal hydroborate or ammonium hydroborate) in the presence of a thiol-type protective agent in a solvent.

Patent Reference 1: JP-A 2001-35255
Patent Reference 2: JP-A 11-319538
Patent Reference 3: JP-A 2003-253311

Problems that the Invention is to Solve

The silver particles obtained according to the vapor-phase method in Patent Reference 1 have a particle size of at most 10 nm, and their dispersibility in solvent is good. However, the vapor-phase production method requires a special apparatus and is therefore unfavorable for industrial-scale mass-production of silver nanoparticles.

Contrary to this, the liquid-phase method is basically suitable for mass-production, but is problematic in that, in liquid, the nanoparticles are extremely highly aggregative and therefore could hardly give a nanoparticle powder of dispersed single particles. In general, for producing nanoparticles, citric acid is used as a dispersant in many cases, and the metal ion concentration in starting liquid is generally at most 10 mmol/L (=0.01 mol/L) and is extremely low, and therefore this is a bar to industrial application of the method.

In Patent Reference 2, dispersed silver nanoparticles are stably produced in a liquid-phase method where the metal ion concentration is from 0.2 to 0.6 mol/L and is high and the starting material concentration is also high. In this, however, a high-molecular-weight dispersant having a number-average molecular weight of tens of thousands is used for inhibiting the aggregation of the particles. The high-molecular-weight dispersant causes no problem when the product is used as a colorant; however, for use in circuit formation, the high-molecular-weight dispersant is hardly combustible and may therefore remain in baking, and in addition, after baking, the interconnecting pattern may have pores formed therein, by which, therefore, the interconnect resistance may increase or the interconnecting pattern may be broken. For these reasons, the silver nanoparticles produced in the method may be problematic in forming microwiring patterns by low-temperature baking. Moreover, the high-molecular-weight dispersant is further problematic in that it increases the viscosity of the dispersion of silver nanoparticles.

In Patent Reference 3, the starting material is reacted at a relatively high concentration of at least 0.1 mol/L in a liquid-phase method, and the produced silver particles having a size of at most 10 nm are dispersed in an organic dispersion medium. In Patent Reference 3, proposed is a thiol-type dispersant. The thiol-type dispersant has a low molecular weight of about 200, and can be readily removed through low-temperature baking in interconnecting formation; however, this contains sulfur (S), and the sulfur ingredient is unfavorable for use in interconnecting formation as causing corrosion of interconnects and other electronic parts.

Accordingly, an object of the present invention is to solve these problems and to produce a dispersion of highly-dispersible spherical silver particles suitable for use in micropatterning for interconnecting formation and having good low-temperature sinterability, inexpensively on a mass-production scale at a high yield.

DISCLOSURE OF THE INVENTION

As a liquid-phase production method for a silver nanoparticle powder that has solved the above-mentioned problems, the invention provides a method for producing a silver particle powder excellent in the dispersibility in a liquid organic medium having a low polarity, which comprises reducing a silver compound in an alcohol having a boiling point of from 80° C. to 200° C. or in a polyol having a boiling point of from 150 to 300° C., at a temperature of from 80° C. to 200° C. under reflux while maintaining the stream having a Reynolds number of not more than $3.70 \times 10^4$. The treatment under reflux means a treatment where the vapor generated by the liquid phase in the reactor under heat is condensed in a cooling zone to convert it into a liquid, and the liquid is returned back to the initial liquid phase in the reactor, and under the condition, the reaction is attained.

The stream having a Reynolds number of not more than $3.70 \times 10^4$ may be kept as such by stirring the liquid at a stirring power of at most $5.68 \times 10^8$ W when the stirring is needed; or when the stirring is not needed, the system is kept in a natural convection to attain the condition.

Preferably, the reduction in the method of the invention is attained in the co-presence of an organic protective agent comprising a primary amine having an unsaturated bond in the structure and having a molecular weight of from 100 to 1000, and in this case, the proportion of the ingredients is preferably as follows:

Ag Ion Concentration: from 0.05 to 5.0 mol/L,
Molar Ratio of Alcohol or Polyol/Ag: from 0.5 to 50,
Molar Ratio of Organic Protective Agent/Ag: from 0.05 to 5.0.

Also preferably, the reduction is attained in the co-presence of a reduction promoter comprising a secondary amine and/or a tertiary amine.

According to the method of the invention, a silver particle powder where the silver particles have a mean particle size $D_{TEM}$ of at most 50 nm are produced advantageously, and the silver particle powder can well disperse in a liquid organic medium having a low polarity. A silver particle powder dispersion prepared by dispersing the silver particle powder obtained according to the production method of the invention, in a liquid organic medium having a low polarity may have the properties of a Newtonian fluid, as follows:

pH: at least 6.5,
Silver Concentration in Dispersion: from 5 to 90 wt. %,
Viscosity: at most 50 mPa·s,
Surface Tension: at most 80 mN/m.

In addition, the dispersion has good dispersibility, capable of passing through a membrane filter having a pore size of (mean particle size of the silver particle powder in the dispersion) +20 nm.

Comprising nanoparticles, the silver particle powder obtained according to the method of the invention can be well dispersed in a liquid organic medium having a low polarity, and therefore it may provide a silver particle powder dispersion having good low-temperature sinterability. The dispersion has a high monodispersion ratio where the individual particles are monodispersed, and is therefore suitable for interconnecting formation according to an inkjet method or for thin film formation in a mode of coating.

BEST MODE FOR CARRYING OUT THE INVENTION

The present inventors have repeated tests for producing a silver particle powder in a liquid-phase method, and have found that, when silver nitrate is reduced in an alcohol having a boiling point of from 85 to 150° C., at a temperature of from 85 to 150° C. (while refluxing the evaporated alcohol in the liquid phase), in the co-presence of a protective agent comprising, for example, an amine compound having a molecular weight of from 100 to 400, then a powder of spherical silver nanoparticles having a uniform particle size can be obtained, and have described it in Japanese Patent Application No. 2005-26805. In addition, the inventors have found that, when a silver compound (typically silver carbonate or silver oxide) is reduced in an alcohol or polyol having a boiling point of not lower than 85° C., at a temperature of not lower than 85° C., in the co-presence of a protective agent comprising, for example, a fatty acid having a molecular weight of from 100 to 400, then a spherical silver particle powder having a uniform particle size and containing few corrosive compounds can be obtained, and have described it in Japanese Patent Application No. 2005-26866. Further, the inventors have found that, when silver nitrate is reduced in an alcohol having a boiling point of from 85 to 150° C., at a temperature of not lower than 85° C. in the presence of an organic protective agent (fatty acid or amine compound having a molecular weight of from 100 to 1000) and when a hydrocarbon having a boiling point of not lower than 85° C., as serving a polarity retarder, is put in the reaction system, then a highly dispersible silver particle powder can be obtained at a high yield, and have described the invention in Japanese Patent Application No. 2005-56035.

In every case, when the silver particle powder is dispersed in a non-polar or poorly-polar liquid organic medium, then a silver particle dispersion can be produced; and when the coarse particles are removed from the dispersion through centrifugation or the like, then a monodispersed dispersion of silver particles of which the particle size fluctuates little (CV as percentage=standard deviation σ/number-average particle size, is less than 40%) can be obtained.

On the other hand, however, the inventors have experienced that, when the reaction efficiency is increased by elevating the reaction temperature or by stirring the system, then coarse particles increase and the intended nanoparticle powder having a size of at most 50 nm could hardly be obtained. When the amount of the amine compound serving as an organic protective agent is increased, then the monodispersion ratio may increase but the reduction ratio lowers, therefore causing a problem in that the yield is lowered. The low monodispersion ratio means that the amount of sintered particles and firmly aggregated particles is large. Specifically, for efficiently obtaining a silver nanoparticle powder of good dispersibility, the mere use of the organic protective agent and the polarity retarder is limitative; and for stably producing a nanoparticle powder containing few coarse particles, improvements from a different aspect are needed.

It is considered that the reaction of forming silver particles in liquid-phase reduction is governed by the following:

1) Silver ion reduction speed,
2) Organic protective agent adsorption speed to silver particles,
3) Crystallization speed through bonding of silver atoms to each other,
4) Silver particle growth/aggregation speed through collision thereof with each other.

Of those, the factors 1) to 3) are governed by the temperature, the silver ion concentration and the molar ratio of organic protective agent/silver of the reaction conditions; and for the factor 4), the stirring speed of the reaction conditions shall be dominant.

As the parameter of the influence of the stirring speed on the dispersion/aggregation of silver particles in a reactor, employed in the invention is a critical stirring speed for floating particles, $n_{js}$ (Progress of Chemical Engineering 34, Mixing Technology, edited by the Society of Chemical Engineering of Japan, p. 132) that is an index of the critical speed necessary for dispersing particles. The critical stirring speed for floating particles, $n_{js}$ is the stirring speed at which the powder having a larger specific gravity than that of the dispersion thereof begins to float in the dispersion in solid-liquid stirring, and is represented by the following formula:

$$n_{js} = Sv^{0.1} d_p^{0.2} (g\Delta\rho/\rho_c)^{0.45} X^{0.13} / D^{0.85}$$

wherein
v=kinematic viscosity of the dispersion,
$d_p$=particle size of the particles,
g=gravitational acceleration,
Δρ=density difference between the particles and the liquid,
$\rho_c$=density of the dispersion,
X=wt. % of the particles,
D=diameter of the stirring blade,
S=factor to be determined by the geometric shape of the reactor such as the diameter of the reactor, the liquid level and the shape of the stirring blade.

When the stirring speed in the reactor is over the critical stirring speed for floating particles, $n_{js}$, then aggregation of particles to each other is promoted. Accordingly, the stirring speed in the reactor must be at most $n_{js}$. The Reynolds number of the critical stirring speed for floating particles, $n_{js}$ in the present system is 18,640, and the stirring power is $2.23\times10^7$ W. In this, the Reynolds number Re is a dimensionless number represented by the following formula (Progress of Chemical Engineering 34, Mixing Technology, edited by the Society of Chemical Engineering of Japan, p. 14):

$$Re=[\{\pi\eta\times ln(D/d)\}/\{4d/\beta D\}]\rho nD^2/\mu,$$

$$\beta=2\times ln(D/d)/\{(D/d)-(d/D)\},$$

$$\eta=0.711[0.157+\{n_p\times ln(D/d)\}^{0.611}]/[n_p^{0.52}\{1-(d/D)^2\}],$$

wherein
  $\rho$=density of liquid,
  n=stirring number,
  $\mu$=viscosity of liquid,
  $n_p$=number of stirring blades.

The stirring power [W] is represented by the following formula (Progress of Chemical Engineering 34, Mixing Technology, edited by the Society of Chemical Engineering of Japan, p. 14):

$$Np=P/(\rho n^3 D^5)$$

wherein
  Np=dimensionless number relating to the necessary power for stirring.

The present inventors have found that, when the Reynolds number of the fluid in a reactor is controlled to be not more than 37,000 and when the stirring power, if any, is controlled to be at most $5.68\times10^8$ W, then a silver particle powder capable of dispersing in a liquid organic medium of low polarity to a high monodispersion ratio can be obtained, while realizing the reaction kept at a high reduction ratio.

Specifically, the invention is characterized in that, in reducing a silver compound in an alcohol having a boiling point of from 80° C. to 200° C. or in a polyol having a boiling point of from 150 to 300° C., under reflux at a temperature of from 80° C. to 200° C., the reaction liquid is so controlled as to be able to maintain the stream having a Reynolds number of not more than $3.70\times10^4$ as such, and accordingly, the opportunity for the silver particles of the formed nuclei to collide with each other to grow and aggregate is reduced, and the silver particles reach the endpoint of their reaction while they are suspended in the liquid still as nanoparticles. For maintaining the stream having a Reynolds number of not more than $3.70\times10^4$ as such by stirring, the stirring power must be at most $5.68\times10^8$ W. In the absence of forced stirring, the stream having a Reynolds number of not more than $3.70\times10^4$ can be formed in a natural convection. In that manner, in the invention, a silver nanoparticle powder having excellent dispersibility in a liquid organic medium having a low polarity can be produced stably.

The terms used in this description and the matters specifically defined in the invention are described below.

[Alcohol or Polyol]

In the invention, a silver compound is reduced in one or more liquids of an alcohol or a polyol functioning as a reducing agent. As the alcohol, herein usable are propyl alcohol, isopropyl alcohol, n-butanol, isobutanol, sec-butyl alcohol, tert-butyl alcohol, allyl alcohol, crotyl alcohol, cyclopentanol, etc. As the polyol, usable are diethylene glycol, triethylene glycol, tetraethylene glycol, etc.

[Silver Compound]

The silver compound to be reduced includes silver chloride, silver nitrate, silver oxide, silver carbonate, etc. From the industrial viewpoint, silver nitrate is preferred, but the compound is not limited to silver nitrate. In the method of the invention, the Ag ion concentration in the liquid during reaction may be at least 50 mmol/L.

[Reduction]

For reduction, a method may be advantageous where the reaction temperature is stepwise elevated for multistage reduction at different reaction temperatures. The reduction is attained under heat and under reflux where the evaporation and the condensation of alcohol or polyol are repeated. The condition under reflux means that all the vapor phase generated in the reaction system is airtightly led into a cooling zone to convert it into a liquid phase and the liquid phase is refluxed to the reaction system, and under the condition, the reaction is attained. The silver compound is reduced with an alcohol or a polyol functioning as a reducing agent, but preferably, the reduction is attained in the co-presence of an organic protective agent and optionally further in the co-presence of a reduction promoter, in addition to maintaining the stream having a Reynolds number of not more than $3.70\times10^4$ as such, as so mentioned in the above.

The reduction with stirring may be attained by stirring the system in the reactor with a magnet stirrer under heat and under the condition of reflux where liquid evaporation and condensation are repeated. In this case, the Reynolds number in the reactor is controlled to be at most 37,000 as so mentioned in the above, preferably at most 8,000, more preferably at most 4,000; and the stirring power is controlled to be at most $5.70\times10^8$ W, preferably at most $3.18\times10^5$ W, more preferably at most $1.28\times10^4$ W, whereby a silver nanoparticle powder can be obtained at a high conversion ratio, at a high degree of dispersion and at a high yield.

[Organic Protective Agent]

As the organic protective agent, herein usable is a fatty acid or an amino compound having a molecular weight of from 100 to 1000. The fatty acid includes propionic acid, caprylic acid, lauric acid, myristic acid, palmitic acid, stearic acid, behenic acid, acrylic acid, oleic acid, linolic acid, arachidonic acid, etc. The amino compound includes ethylamine, allylamine, isopropylamine, propylamine, ethylenediamine, 2-aminoethanol, 2-butanamine, n-butylamine, t-butylamine, 3-hydroxypropylamine, 3-(methylamino) propylamine , 3-methoxypropylamine, cyclohexylamine, hexylamine, 3-(dimethylamino)propylamine, hexanolamine, piperazine, benzylamine, m-phenylenediamine, o-phenylenediamine, p-phenylenediamine, 1,6-hexanediamine, hexamethylenediamine, 2-methyl-1,3-phenylenediamine, tolylene-3,4-diamine, anisidine, 2-ethylhexylamine, m-xylene-$\alpha,\alpha'$-diamine, xylylenediamine, toluidine, 3-(2-ethylhexyloxy) propylamine, oleylamine, etc.

One or more of these may be used as the organic protective agent, either singly or as combined. Especially preferred is a metal-coordinating compound coordinable with silver. In case where a compound not or poorly coordinable with silver is used, a large amount of the protective agent is needed in forming the silver nanoparticles, which, however, is impracticable. Of the amino compounds, preferred is a primary amine. The amino compound preferably has a molecular weight of from 100 to 1000. The compound having a molecular weight of less than 100 may be poorly effective for inhibiting aggregation of particles; and the compound having a molecular weight of more than 1000 may have a high aggregation-inhibitory power, but it may retard the sintering of silver particles when a silver powder dispersion is applied onto a substrate and baked thereon, thereby increasing the interconnecting resistance, and, as the case may be, the sintered wiring could not have electroconductivity. More preferred is a primary amine, and even more preferred is an amino compound having at least one unsaturated bond in one molecule. Of those, even more preferred is oleylamine.

[Reduction Promoter]

As the reduction promoter, usable is an amino compound having a molecular weight of from 100 to 1000. It includes, for example, diisopropylamine, diethylenetriamine, N-(2-aminoethyl)ethanolamine, diethanolamine, bis(2-cyanoethyl)amine, iminobis(propylamine), N-n-butylaniline, diphenylamine, di-2-ethylhexylamine, dioctylamine, trimethylamine, dimethylethylamine, N-nitrosodimethylamine, 2-dimethylaminoethanol, dimethylaminoethanol, triethylamine, tetramethylethylenediamine, diethylethanolamine, methyldiethanolamine, triallylamine, N-methyl-3,3'-iminobis(propylamine), triethanolamine, N,N-dibutylethanolamine, 3-(dibutylamino)propylamine, N-nitrosodiphenylamine, triphenylamine, tri-n-octylamine, etc.

As the reduction promoter, one or more these amino compounds may be used either singly or as combined. Like the organic protective agent, an amino compound having a molecular weight of from 100 to 1000 is preferred for the reduction promoter. This is because the compound having a molecular weight of less than 100 may be poorly effective for inhibiting aggregation of particles; and the compound having a molecular weight of more than 1000 may have a high aggregation-inhibitory power, but it may retard the sintering of silver particles when a silver powder dispersion is applied onto a substrate and baked thereon, thereby increasing the interconnecting resistance, and, as the case may be, the sintered interconnecting could not have electroconductivity. Of amino compounds, more preferred are secondary and tertiary amines having a strong reducing power; and of those, more preferred for use herein are diethanolamine and triethanolamine.

[Liquid Organic Medium]

The silver particle powder obtained according to the method of the invention is well dispersible in a liquid organic medium having a low polarity. As the liquid organic medium for the dispersion, usable is a non-polar or poorly-polar liquid organic medium having a boiling point of from 60 to 300° C. "Non-polar or poorly-polar" as referred to herein means that the relative dielectric constant at 25° C. of the medium is at most 15, more preferably at most 5. When the relative dielectric constant thereof is more than 15, it is unfavorable since the dispersibility of silver particles in the medium may be poor or the particles may precipitate therein. Depending on the use of the dispersion, various liquid organic media can be used, but preferred are hydrocarbons. In particular, herein usable are aliphatic hydrocarbons such as isooctane, n-decane, isododecane, isohexane, n-undecane, n-tetradecane, n-dodecane, tridecane, hexane, heptane, etc; and aromatic hydrocarbons such as benzene, toluene, xylene, ethylbenzene, decalin, tetralin, etc. One or more these liquid organic media can be used either singly or as combined. A mixture such as kerosene is also usable. Further, for controlling the polarity, a polar organic medium of alcohols, ketones, ethers, esters or the like may be added within a range within which the mixed liquid organic media may have a relative dielectric constant at 25° C. of at most 15.

The dispersion prepared by dispersing the silver particle powder of the invention in the liquid organic medium does not contain a binder or the like having a high boiling point, and therefore it may be a silver particle powder dispersion of which the weight loss by forced heating, in other words, ignition loss (reduced weight after thermal treatment at 300° C.—reduced weight after thermal treatment at 1000° C.) is within 5% of the dispersion.

The dispersion may have the properties of a Newtonian fluid, as follows:
pH: at least 6.5,
Silver Concentration in Dispersion: from 5 to 90 wt. %,
Viscosity: at most 50 mPa·s,
Surface Tension: at most 80 mN/m.

In addition, the dispersion has good dispersibility, capable of passing through a membrane filter having a pore size, that is, mean particle size of the silver particle powder in the dispersion +20 nm.

[Reduction Ratio]

The reduction ratio indicates the ratio of the weight of silver (b) formed as silver nanoparticles at the end of the reduction to the weight of silver (a) fed at the start of the reaction, and is represented by the following formula:

$$\text{Reduction Ratio (\%)} = (b/a) \times 100.$$

[Monodispersion Ratio]

The monodispersion ratio indicates the ratio of the weight of the silver nanoparticles (c) in the dispersion to the weight of silver (b) of the silver nanoparticles produced through reduction, and is represented by the following formula:

$$\text{Monodispersion Ratio (\%)} = (c/b) \times 100.$$

[Yield]

The yield is one computed by multiplying the reduction ratio and the monodispersion ratio, and means the weight of the silver nanoparticles (c) in the dispersion to the weight of silver (a) fed at the start of the reaction, and this is represented by the following formula:

$$\begin{aligned}\text{Yield (\%)} &= \frac{\text{Reduction ratio (\%)} \times \text{monodispersion ratio (\%)}}{100}\\ &= (b/a) \times (c/b) \times 100\\ &= (c/a) \times 100.\end{aligned}$$

The weight of silver (b) formed as silver particles at the end of reduction, and the weight of the silver nanoparticles (c) in the dispersion are computed according to the method mentioned below, after the washing, dispersion and classification steps mentioned below.

Washing Step:

(1) The slurry (40 mL) after the reaction is processed for solid-liquid separation at 3000 rpm for 30 minutes, using Hitachi Koki's centrifuge CF7D2, and the supernatant is removed.

(2) Methanol (40 mL) is added to the residue, which is dispersed with an ultrasonic disperser.

(3) The above (1)→(2) is repeated three times.

(4) The above (1) is carried out, and the supernatant is removed and the residue is collected.

Dispersion Step:

(1) Kerosene (boiling point, 180 to 270° C.) (40 mL) is added to the residue after the above washing step.

(2) Next, this is processed with an ultrasonic disperser.

Classification Step:

(1) The mixture (40 mL) of the silver particles and kerosene after the dispersion step is processed for solid-liquid separation at 3000 rpm for 30 minutes, using the same centrifuge as in the above.

(2) The supernatant is collected. The supernatant is the final silver particle powder dispersion. Its weight is (d).

Method of Calculation of the Weight of Silver Formed as Silver Nanoparticles at the End of Reduction:

(1) After the reaction, the overall weight (e) of the slurry obtained, and the weight (f) of the slurry (40 mL) taken in the above washing step are measured.

(2) The residue collected in the above washing step is put into a container of which the weight is known, and dried in vacuum at 200° C. for 12 hours, using Yamato Science's square vacuum drier ADP-200.

(3) After cooled to room temperature, this is taken out of the vacuum drier, and its weight is measured.

(4) The container weight is subtracted from the weight measured in the above (3), and this is the weight of silver (g) formed as silver nanoparticles in the slurry (40 mL) after the reaction.

(5) The weight of silver (b) formed as silver nanoparticles at the end of reduction is computed according to the following formula:

$$b=(g/f)\times e.$$

Method of Computing the Silver Particle Powder Concentration in Silver Particle Powder Dispersion:

(1) The silver particle powder dispersion produced in the above classification step is transferred into a container of which the weight is known.

(2) The container is set in a vacuum drier, and the dispersion therein is concentrated and dried by elevating the vacuum degree and the temperature in the container while paying careful attention thereto so as not to bring about bumping; and after the liquid has disappeared, the residue is further dried at 240° C. in vacuum for 12 hours.

(3) After cooled to room temperature, the residue is taken out of the vacuum drier, and its weight is measured.

(4) The container weight is subtracted from the weight in (3), thereby giving the weight (h) of the silver particles in the silver particle powder dispersion.

(5) The silver particle concentration in the dispersion is computed according to the following formula:

$$h/d\times 100.$$

The monodispersion ration, $c/b\times 100$ can be substituted by the following formula:

$$c/b\times 100=h/g\times 100.$$

Accordingly, the weight (c) of the silver nanoparticles in the dispersion can be computed according to the following formula:

$$c=b\times h/g.$$

[Mean Particle Size $D_{TEM}$]

The silver particle powder obtained in the invention has a mean particle size (referred to as $D_{TEM}$), as measured through TEM (transmission electronic microscope) observation, of at most 200 nm, preferably at most 100 nm, more preferably at most 50 nm, even more preferably at most 30 nm, as the case may be, still more preferably at most 20 nm. Accordingly, the silver particle powder dispersion of the invention is favorable for micro-interconnecting formation. In TEM observation, a 600,000-magnification enlarged image is analyzed, on which the diameter of 300 independent non-overlapping particles is measured, and the data are averaged.

[X-Ray Crystal Diameter $D_X$]

The silver particle powder of the invention has a crystal diameter (referred to as $D_X$) of at most 50 nm. The X-ray crystal diameter of the silver particle powder can be computed according to the Scherrer's formula from the X-ray diffractometry data. This is described below.

The Scherrer's formula is expressed by the following general formula:

$$D_X=K\cdot\lambda/\beta \cos\theta,$$

wherein K is the Scherrer constant, $D_X$ is the crystal diameter, $\lambda$ is the wavelength of X-ray given to the sample, $\beta$ is the half value width of the peak in X-ray diffractiometry, $\theta$ is the Bragg angle of diffraction line. When a value of 0.94 is taken for K and when Cu is used for the bulb of X-ray, then the above formula may be rewritten to the following:

$$D_X=0.94\times 1.5405/\beta \cos\theta.$$

[Degree of Monocrystallinity]

The silver particle powder of the invention has a degree of monocrystallinity ($D_{TEM}/D_X$) of at most 2.0. Accordingly, the powder may form micro-interconneting patterns and its migration resistance is excellent. When the degree of monocrystallinity is more than 2.0, then it is unfavorable since the degree of polycrystallinity of the powder increases and since the powder often contains impurities between the polycrystal particles therefore forming pores in baking and failing to form micro-interconnecting patterns. In addition, the impurities between the polycrystal particles worsen the migration resistance of the powder.

[Viscosity]

The dispersion of the silver particle powder dispersed in a liquid organic medium according to the invention is a Newtonian fluid, and its viscosity at a temperature of 25° C. is at most 50 mPa·s. Accordingly, the silver particle dispersion of the invention is favorable for a interconnecting material according to an inkjet method. In interconnecting formation according to an inkjet method, the droplets landing on the substrate are required to be quantitatively uniform for the purpose of maintaining the planarity of the interconnecting pattern. Since the silver particle dispersion of the invention is a Newtonian fluid and has a viscosity of at most 50 mPa·s, its droplets can be smoothly jetted out with no trouble of nozzle clogging, and therefore can satisfy the above-mentioned requirement. The viscosity may be measured at a constant temperature of 25° C., using Toki Sangyo's R550 Model viscometer, RE550L with a corn rotor 0.8° fitted thereto.

[Surface Tension]

The silver particle dispersion of the invention has a surface tension at 25° C. of at most 80 mN/m. Accordingly, this is favorable for an interconnecting material according to an inkjet method. A dispersion having a large surface tension could not form a stable meniscus in the nozzle tip, and therefore the discharge amount and the jetting timing are difficult to control with the result that the droplets having landed on a substrate have poor wettability and the planarity of the interconnecting pattern is poor. As opposed to this, since the surface tension of the silver particle dispersion of the invention is at most 80 mN/m, the dispersion is free from the above problem and may form an interconnecting pattern of good quality. The surface tension may be measured at a constant temperature of 25° C., using Kyowa Interface Science's CBVP-Z.

[Diameter of Particles Passing through Membrane Filter]

The dispersion of silver particles of the invention passes through a membrane filter having a pore size that is mean particle size of silver particle powder ($D_{TEM}$)+20 nm. The powder passes through the pores having a size larger by 20 nm than the mean particle size of the silver particles ($D_{TEM}$), and therefore, this means that the individual silver particles in the dispersion are flowable in the liquid not aggregating together, or that is, the particles are almost completely monodispersed. Because of this, therefore, the dispersion of silver particles of the invention is extremely favorable for an interconnecting material according to an inkjet method. When the dispersion partly contains aggregated particles, then it often clogs a nozzle and, in addition, the formed interconnecting pattern is poorly dense and gives pores in baking, therefore causing resistance increase and interconnecting breakage. However, the dispersion of the invention is free from the problem. In the membrane filter passing test, usable is Whatman's Anotop Plus 25 syringe filter (pore size 20 nm) as a filter having the smallest pore size.

[pH]

The silver particle dispersion of the invention has a pH (hydrogen ion concentration) of at least 6.5. Accordingly, the dispersion is characterized in that, when used as a wiring material, it does not corrode the copper foil on a circuit board and it is resistant to migration between wiring lines. The pH of the dispersion may be measured, using Horiba's pH meter, D-55T and pH electrode for low-conductive water/waterless solvent, 6377-10D. In case where the pH of the dispersion measured according to the method is less than 6.5, then the acid ingredient of the dispersion may corrode the copper foil on a circuit board and there may often occur migration between the formed wiring lines, and the reliability of the circuit is thereby lowered.

[Ignition Loss]

The ignition loss (%) of the silver particle dispersion is a value represented by the following formula:

Ignition loss (%)=100×[$(W_{50}-W_{300})/W_{50}-(W_{50}-W_{1000})/W_{50}$]

wherein $W_{50}$, $W_{300}$ and $W_{1000}$ each mean the weight of the dispersion at a temperature of 50° C., 300° C. and 1000° C., respectively.

The ignition loss of the silver particle dispersion of the invention is less than 5%. Since the ignition loss thereof is less than 5%, the organic protective agent in the dispersion can be burnt in a short period of time in baking, therefore giving an interconnecting pattern of good electroconductivity not retarding the sintering thereof. When the ignition loss is 5% or more, the organic protective agent may act as a sintering inhibitor in baking, and it is unfavorable since the interconnecting resistance increases and, as the case may be, the electroconductivity of the interconnecting pattern may be lowered.

The ignition loss may be determined with MacScience/ Bruker AXS' TG-DTA2000 Model tester, under the condition mentioned below.

Sample Weight: 20±1 mg,
Heating Speed: 10° C./min,
Atmosphere: air (with no aeration)
Standard Sample: alumina, 20.0 mg,
Sample Pan: Rigaku's alumina sample pan,
Temperature Range: 50° C. to 1000° C.

The silver particle powder obtained in the invention is favorable for an interconnecting material for wirings on LSI boards and electrodes and wirings for FPD (flat panel displays), and for embedding of micro-size trenches, via holes, contact holes, etc. The powder is also applicable to colorants for vehicle painting, and is applicable to carriers for adsorbing biochemical substances and others in the field of medicine, diagnosis and biotechnology.

The silver particle powder obtained in the invention can be sintered at low temperatures, and is therefore usable as an electrode-forming material on flexible films, and as a bonding material in electronics packaging. In addition, the powder is also favorable for use in conductive films such as electromagnetic wave shield films, transparent conductive films and the like, and for use in IR reflection shield taking advantage of the optical properties of the powder. Further, taking advantage of the low-temperature sinterability and the electroconductivity thereof, the powder may be printed and baked on a glass substrate and may be favorably used as antifogging heating elements for vehicle windshields. On the other hand, the dispersion exhibits nearly the same behavior as that of a liquid (dispersion medium), and therefore it can be readily applicable to various coating methods of spin coating, dipping, blade coating, dispenser coating or the like, and to screen printing, not limited to the above-mentioned inkjet method.

EXAMPLES

Example 1

Oleylamine (by Wako Pure Chemical, Mw=267) (185.83 mL) as an organic protective agent, and silver nitrate crystal (by Kanto Chemical) (19.218 g) as a silver compound were added to isobutanol (by Wako Pure Chemical, special class grade chemical) (140 mL) as a reaction medium serving also as a reducing agent, and stirred with a magnet stirrer to dissolve silver nitrate.

The solution was transferred into a chamber provided with a reflux unit, put on an oil bath and stirred with a magnet stirrer with introducing an inert gas, nitrogen into the chamber at a flow rate of 400 mL/min, whereupon this was heated at 108° C. under reflux for 5 hours with the stirring power kept at from $1.17 \times 10^4$ to $1.28 \times 10^4$ W so that the solution in the reactor could maintain a flow having a Reynolds number of from 3600 to 3800. The heating speed was 2° C./min.

After the reaction, the slurry was washed, dispersed and classified in the manner described herein, and the reduction ratio, the monodispersion ratio and the yield were computed according to the methods described herein. As a result, the reduction ratio was 89.1%, the monodispersion ratio was 82.2%, and the yield was 73.3%. The degree of monocrystallinity ($D_{TEM}/D_X$) was 1.92.

Example 2

The same process as in Example 1 was repeated, in which, however, the solution in the reactor was stirred with a magnet stirrer with a stirring power of from $3.03 \times 10^5$ to $3.18 \times 10^5$ W so that it could maintain a flow having a Reynolds number of from 7300 to 7450.

After the reaction, the slurry was washed, dispersed and classified in the manner described herein, the TEM particle size was measured and the reduction ratio, the monodispersion ratio and the yield were computed according to the methods described herein. As a result, the reduction ratio was 96.7%, the monodispersion ratio was 68.4%, and the yield was 66.1%. The degree of monocrystallinity was 1.19.

Example 3

The same process as in Example 1 was repeated, in which, however, the solution was not stirred but was kept in a natural convection so that it could maintain a flow having a Reynolds number of not more than 400.

After the reaction, the slurry was washed, dispersed and classified in the manner described herein, the TEM particle size was measured and the reduction ratio, the monodispersion ratio and the yield were computed according to the methods described herein. As a result, the reduction ratio was 94.3%, the monodispersion ratio was 88.8%, and the yield was 83.7%.

The degree of monocrystallinity was 0.52. Even though the solution was not forcedly stirred as in this Example, the solution could still maintain a flow having a Reynolds number of not more than 400 owing to the blowing introduction of nitrogen gas thereinto and the reflux flow of repetitive evaporation and condensation, and it may be said that even the natural convection flow could attain a good stirring effect.

Comparative Example 1

The same process as in Example 1 was repeated, in which, however, the solution in the reactor was stirred with a magnet stirrer with a stirring power of from $5.81 \times 10^8$ to $7.29 \times 10^8$ W so that it could maintain a flow having a Reynolds number of from 37100 to 40000.

After the reaction, the slurry was washed, dispersed and classified in the manner described herein, the TEM particle size was measured and the reduction ratio, the monodispersion ratio and the yield were computed according to the methods described herein. As a result, the reduction ratio was 82.5%, the monodispersion ratio was 30.5%, and the yield was 25.2%. Since the stirring in the reactor was reinforced, the aggregation of the particles was accelerated and the monodispersion ratio greatly lowered. In addition, the degree of monocrystallinity was 3.14, and the obtained silver particle powder tended to be polycrystalline.

The invention claimed is:

1. A method for producing a dispersion of a silver particle powder in a liquid organic medium having a low polarity, which comprises reducing a silver compound in an alcohol having a boiling point of from 80° C. to 200° C. or in a polyol having a boiling point of from 150 to 300° C. under a co-presence of an organic protective agent of a primary amine having an unsaturated bond in a structure thereof and having a molecular weight of from 100 to 1000, at a temperature of from 80° C. to 200° C. under reflux while a liquid phase stream is maintained to have a Reynolds number of not more than $3.70 \times 10^4$, thereby obtaining a slurry containing the silver particle powder, separating the silver particle powder from the slurry, and dispersing the powder in the liquid organic medium thereby obtaining the dispersion of the silver particle powder having the properties of a Newtonian fluid as follows:

pH: at least 6.5, silver concentration in dispersion: from 5 to 90 wt.%, viscosity: at most 50 mPa·s, and surface tension: at most 80 mN/m, wherein the stream having a Reynolds number of not more than $3.70 \times 10^4$ is kept in a natural convection.

2. The method for producing a dispersion of a silver particle powder as claimed in claim 1, wherein the mean particle size $D_{TEM}$ of the silver particles is at most 50 nm.

3. The method for producing a dispersion of a silver particle powder as claimed in claim 1, wherein the reduction is attained at an Ag ion concentration of from 0.05 to 5.0 mol/L and in a ratio by mol, alcohol/Ag or polyol/Ag of from 0.5 to 50.

4. The method for producing a dispersion of a silver particle powder as claimed in claim 1, wherein the reduction is attained in the co-presence of a reduction promoter.

5. The method for producing a dispersion of a silver particle powder as claimed in claim 4, wherein the reduction promoter is a secondary amine and/or a tertiary amine.

6. The method for producing a dispersion of a silver particle powder as claimed in claim 1, wherein the dispersion passes through a membrane filter having a pore size of mean particle size of the silver particle powder in the dispersion +20 nm.

* * * * *